United States Patent [19]
Madan et al.

[11] Patent Number: 6,141,240
[45] Date of Patent: Oct. 31, 2000

[54] APPARATUS AND METHOD FOR STATIC RANDOM ACCESS MEMORY ARRAY

[75] Inventors: Sudhir K. Madan, Dallas; Bob D. Strong, Sachse, both of Tex.

[73] Assignee: Texas Instruments Incorporated, Dallas, Tex.

[21] Appl. No.: 09/395,803

[22] Filed: Sep. 14, 1999

Related U.S. Application Data

[60] Provisional application No. 60/100,722, Sep. 17, 1998.

[51] Int. Cl.$^7$ ....................................................... G11C 7/00
[52] U.S. Cl. ...................... 365/156; 365/154; 365/230.06
[58] Field of Search .................................... 365/154, 156, 365/203, 230.06

[56] References Cited

U.S. PATENT DOCUMENTS

| | | | |
|---|---|---|---|
| 5,668,770 | 9/1997 | Itoh et al. ................................ | 365/154 |
| 5,757,702 | 5/1998 | Iwata et al. ............................. | 365/156 |
| 5,864,511 | 1/1999 | Sato ........................................ | 365/156 |
| 5,936,911 | 8/1999 | Inaba ...................................... | 365/154 |

*Primary Examiner*—Son T. Dinh
*Attorney, Agent, or Firm*—Robby T. Holland; Carlton H. Hoel; Frederick J. Telecky, Jr.

[57] ABSTRACT

A static random access memory array (200) with power supplies and an array biasing scheme is disclosed. A power supply (202) has an output voltage that is applied to the bitlines (40). The output voltage pre-charges the bitlines (40) to read from the memory cells (10). An array power supply (204) has an array voltage that is applied to the memory cells. The array voltage is higher than the output voltage. The array power supply (204) is drived by boosting the output voltage of the power supply (202).

5 Claims, 1 Drawing Sheet

APPARATUS AND METHOD FOR STATIC RANDOM ACCESS MEMORY ARRAY

This application claims priority under 35 USC §119(e)(1) of provisional application No. 60/100,722 filed Sep. 17, 1998.

TECHNICAL FIELD OF THE INVENTION

The present invention relates in general to memory systems and more particularly to a static random access memory array.

BACKGROUND OF THE INVENTION

Memory systems are known in the art and used in nearly all micro-processor and digital equipment applications. Memory systems generally utilize different types of memory for different applications. Once such type of memory is Static Random Access Memory ("SRAM"). SRAM systems have the advantage of high speed and ease of use as compared to some other types of memory systems. In addition, SRAM systems using MOS technology exhibit extremely low standby power and do not require a refresh cycle to maintain the information stored in the SRAM system. These attributes make SRAM systems particularly desirable for portable equipment, such as laptop computers.

In an integrated circuit, SRAM systems are often organized into an array of memory cells, arranged in rows and columns. Generally, memory cells are set to one of two data states when storing a bit of information. Each memory cell may be referenced by a unique memory address, which includes a row address and a column address. The term "wordline" generally refers to one or more conductors that correspond to a row of memory cells, whereas the term "bitlines" generally refers to a set of conductors that correspond to a column of memory cells. A memory cell typically includes of pair of complementary ports, with each port connected to one of the two bitlines dedicated to that column. Memory devices commonly operate in a read mode and a write mode. When writing to a memory cell, the wordline is activated, thereby activating the entire row in the array of memory cells. A differential current is applied to the bitlines between the two complementary input/output ports of the memory cell. The memory cell is latched to a specific logic state with a logic high indicated on one port and a logic low indicated on the other port. When reading from a memory cell, the wordline is activated and the logic states on the bitlines associated with the memory cell is differentially sensed using a sense amplifier. The sense amplifier outputs an amplify signal corresponding to the logic state written to the memory cell.

A typical six transistor SRAM memory cell consists of two p-ch pull-up transistors, two n-ch pull-down transistors and two access transistors which are typically n-ch.

High read current, write trip voltage and static noise margin, and low standby current are desired cell characteristics of a SRAM cell. High read current and write trip voltages are needed to improve the speed at which the data can be accessed and written, respectively. High static noise margin is needed for the circuit stability. Low standby current is needed to lower the power consumption when the cell is in the standby mode. Low standby current is achieved by keeping the threshold voltages of the various transistors high so that the subthreshold leakage current can be minimized. Increasing the n-channel threshold voltages, however, reduces the drive current and, hence, the read current during a read operation. It also reduces the write voltage, which results in slower write operations. Also, increasing the p-channel threshold voltage reduces the static noise margin, which hampers cell stability. Thus, a tradeoff exists between the low standby current and the speed and stability of the cell. The problem becomes more severe for lower supply voltages when the threshold voltage is a large fraction of the supply voltage, e.g., the case when the supply voltage is approximately one volt.

A conventional solution to this problem has been to increase the internal supply voltage for the SRAM array to a maximum limit determined by gate oxide thickness and the device reliability. The problem with this type of biasing scheme is that the high voltage level can be very inefficient from the power consumption point of view. Also, because this boosted voltage would be applied to the bitlines, a large amount of supply current is needed to operate the SRAM array and poses difficulties in generating the boosted power.

Another conventional solution to speed up the read and write operation has been to boost the wordline voltage over the bitline and array supply. However, this approach has the disadvantage of lowering the static noise margin and hence the stability of the cell.

Another conventional solution has been to step down the bitline voltage to be lower than the supply voltage. Again, this method may or may not save power depending upon the bitline voltage level and how it is step down.

SUMMARY OF THE INVENTION

From the foregoing, it may be appreciated that a need has arisen for an array of memory cells with an increased static noise margin without reduced read and write capabilities and at the same time maintaining low power consumption. In accordance with the present invention, an apparatus and method for a static random access memory array is provided that substantially eliminates or reduces disadvantages and problems associated with conventional SRAM array designs and operations.

An apparatus for a static random access memory array is disclosed. The static random memory array comprises of plurality of bitlines connected to a plurality of memory cells. A power supply has an output voltage that is applied to the bitlines to read from the memory cells. An array power supply has an array voltage that is applied to the memory cells. The array voltage is higher than the output voltage. The array power supply is derived by boosting the output voltage. In another embodiment, both the wordline and array voltages may be boosted over the bitline voltage to improve the cell performance but the difference between the wordline and bitline power supplies is kept below the access transistor threshold voltage.

A technical advantage of the present invention is that a method for operating a static random access memory array is provided. Another technical advantage of the present invention is that it increases the speed and stability of the memory cells in an array without significantly increasing the power required to operate the cells.

BRIEF DESCRIPTION OF THE DRAWINGS

For a more complete understanding of the present invention and its advantages thereof, references now made to the following description taken in conjunction with the accompanying drawings, wherein like reference numerals represent like parts, in which.

DETAILED DESCRIPTION OF THE INVENTION

Figure 1:
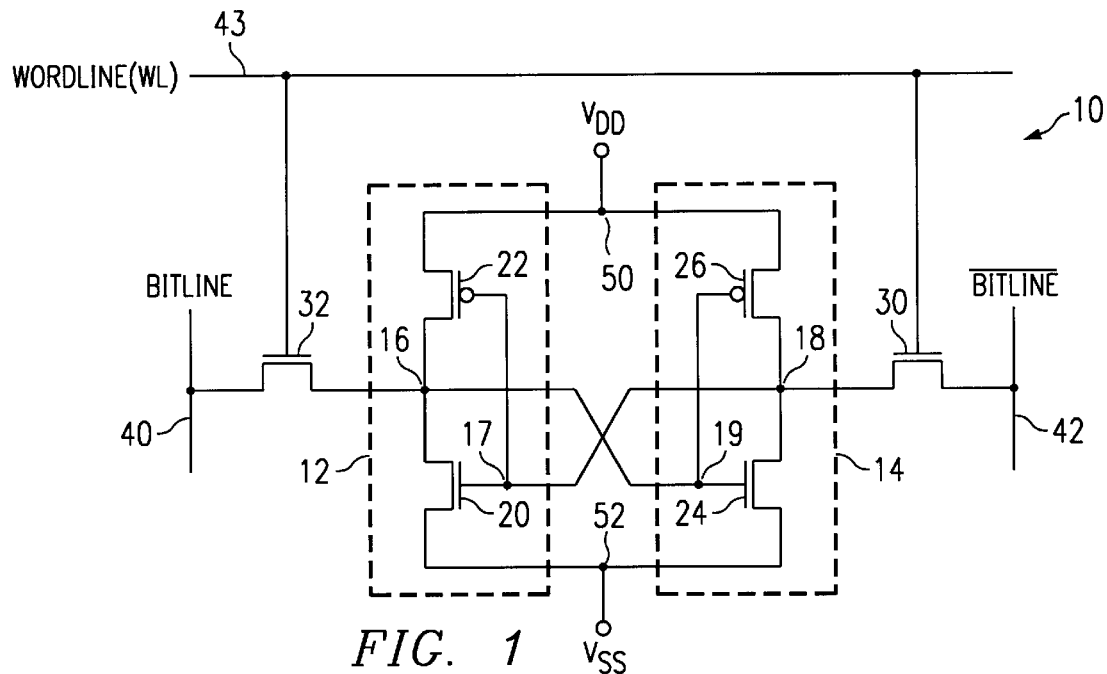
FIG. 1 illustrates a schematic diagram of a six transistor static random access memory cell in accordance with one embodiment of the present invention.
Figure 2:
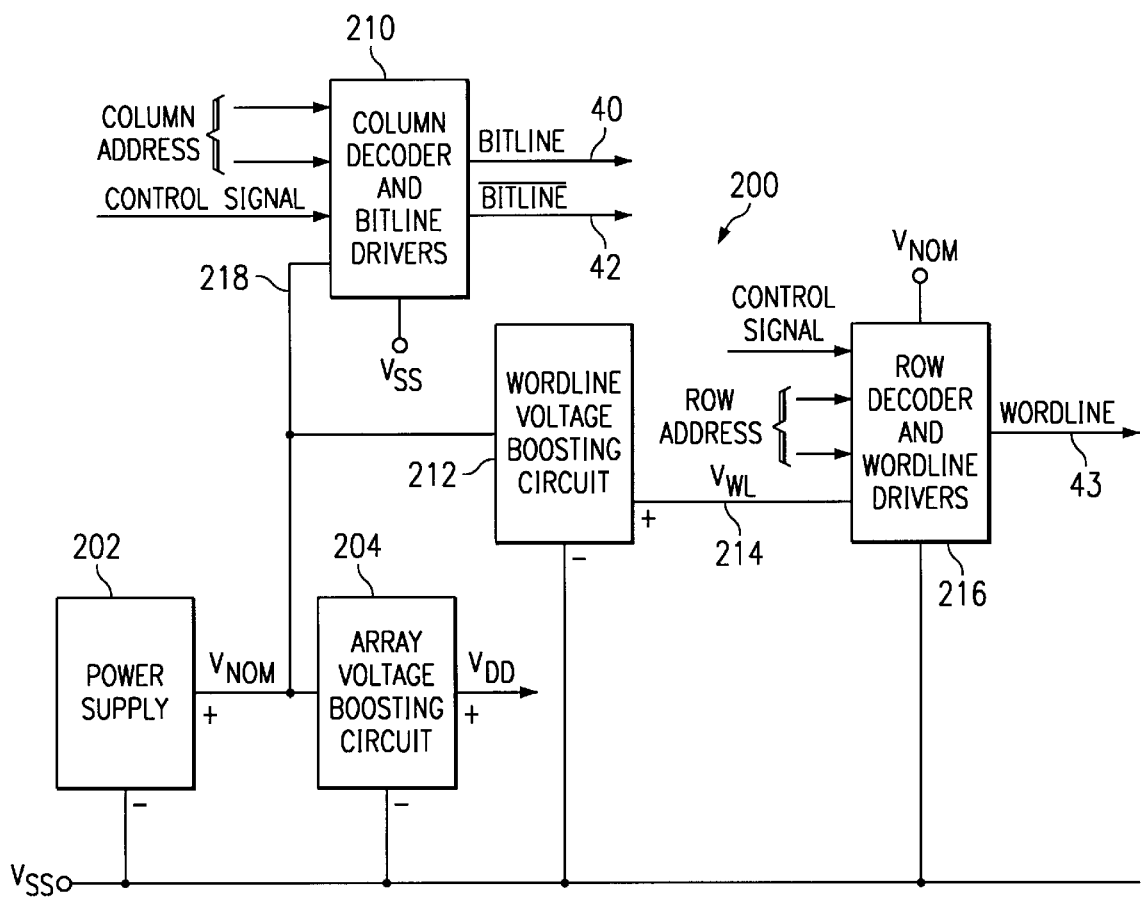
FIG. 2 is a block diagram illustrating a static random access memory array in accordance with one embodiment of the present invention.

The preferred embodiment of the present invention and its advantages are best understood by referring now in more detail to FIGS. 1 and 2 of the drawings, in which like numerals refer to like parts. FIGS. 1 and 2 illustrate a static random access memory array in accordance with one embodiment of the present invention.

FIG. 1 is a simplified schematic diagram of a six transistor, low voltage, low power SRAM memory cell 10. Low voltage, low power SRAM cell 10 includes a first inverter 12 having a first pull-up transistor 22 between a high end of the array voltage, $V_{DD}$, node 50, and a first inverter output node 16. First inverter 12 also has a first pull-down transistor 20 connected between output node 16 and a ground voltage, $V_{ss}$, node 52. SRAM cell 10 also includes a second inverter 14 having a second pull-up transistor 26 and a second pull-down transistor 24. Second pull-up transistor 26 is connected between $V_{DD}$ node 50 and output node 18 of second inverter 14. Second pull-down transistor 24 is connected between output node 18 and $V_{ss}$ node 52. Inverters 12 and 14 are cross-coupled, i.e., output node 16 of first inverter 12 is connected to an input node 19 of second inverter 14 and output node 18 of second invertor 14 is connected to an input node 17 of first inverter 12. A first access transistor 32 is connected between output node 16 of first invertor 12 and a first bitline ("Bitline") bus 40. The cell also includes a second access transistor 30 connected between output node 18 of second inverter 14 and a second bitline ("Bitline Bar") bus 42. The gates of the first access transistor 32 and second access transistor 30 are connected to wordline bus 43.

Typically, the signal for wordline bus 43 is derived from the X-address, or row select, and the signal for the bitline buses 40 and 42 is derived from the Y-address, or column select. The bitline buses run perpendicular to the wordline bus 43. That is, if wordline bus 43 is running in the X-direction, the bitlines buses 40 and 42 run in the Y-direction.

Referring to FIG. 2, a static random access memory array 200 with power supplies and a biasing scheme is disclosed. SRAM array 200 has a power supply 202, which may be an external power source or derived on-chip. Power supply 202 creates a supply voltage, $V_{nom}$, that is applied to array voltage boosting circuit 204. Array voltage boosting circuit 204 boosts array voltage, $V_{DD}$, which is applied to the memory cells, as disclosed in FIG. 1.

Power supply 202 also supplies supply voltage $V_{nom}$ to column decoder and bitline drivers 210. Column decoder 210 receives a column address during read and write operations, which correlates to the Y-value in a 2-dimensional addressing array used in the preferred embodiment.

Power supply 202 is also connected to wordline voltage boosting circuit 212. Wordline supply voltage $V_{WL}$ is the result of the boosted $V_{nom}$. Wordline voltage boosting circuit 212 supplies the $V_{WL}$ voltage source to row decoder and wordline driver circuit 216. Row decoder 216 may be supplied with other voltage sources, e.g., $V_{nom}$, to optimize its performance and power consumption. Row decoder 216 receives row address commands during read and write operations. These operations serve to indicate the X-value in a 2-dimensional addressing array in the preferred embodiment. Thus, when wordline 43 is activated, wordline voltage $V_{WL}$ may be greater than supply voltage $V_{nom}$. Column decoder 210 and row decoder 216 may receive a control signal.

In an embodiment, external power supply voltage $V_{nom}$ is used as the power supply for the bitline biasing circuitry. Thus, the bitlines' voltage range is between $V_{ss}$ and $V_{nom}$. Array supply voltage, $V_{DD}$, is derived by boosting the external supply voltage using known techniques. Similarly, the wordline voltage, $V_{wl}$, is also derived by boosting the external supply voltage so that the wordlines are switched between $V_{ss}$, when they are non-active, and $V_{wl}$, when they are active. In many applications, it may be advantageous to have only one voltage boosting circuit, such that $V_{wl}$ and $V_{DD}$ are equal.

Depending upon the data (1 to 0) stored in a cell, either inverter output node 16 or 18 may be at a low (close to $V_{ss}$) voltage and the other will be at a high (close to $V_{DD}$) voltage, when wordline 43 is non-active. The current that flows from the array supply voltage $V_{DD}$ is determined by the off leakage currents of one of the pull-up transistors 22 and 26 and one of the pull-down transistors 20 or 24, depending upon the stored state (1 or 0). In high performance SRAM's, that off state leakage typically is determined by the sub-threshold leakage current of the transistors. The contribution from the junction leakages are much lower, and ignored. Transistors 20, 22, 24 and 26 also contribute to the array supply current because the bitline voltage is lower than the output voltage of one of the inverters, which is at $V_{DD}$. These off state sub-threshold leakage currents for access transistors 30 and 32, pull-down transistors 20 and 24 and pull-up transistors 22 and 26 contribute to the array standby current.

During a read operation, bitline 40 and bitline 42 are pre-charged to $V_{nom}$ before wordline 43 is activated. Wordline 43 is activated by applying voltage $V_{wl}$ to wordline 43. This activation results in large current flowing through a first access transistor, either 30 or 32, which pulls down the voltage of the attached bitline. The current through the second access transistor is determined by its characteristics, such as the threshold voltage, drive current, sub-threshold leakage characteristics, bias conditions, etc. The drain for the second access transistor is at $V_{DD}$, with the source at $V_{nom}$ and the gate at $V_{wl}$. The net current through the second access transistor is supplied by the boosted array supply, $V_{DD}$, through the p-ch pull-up transistors 22 or 26, and is minimized to reduce the power consumption. In order to minimize this power, the difference between $V_{wl}$ and $V_{nom}$ is kept below the threshold voltage of access transistors 30 and 32. Because the source (bitline) is at voltage $V_{nom}$, the threshold voltage may include its reverse bias body effect.

Typically, during a write operation, either bitline 40 or bitline bar 42 is lowered to $V_{ss}$ with the other at $V_{nom}$. Wordline 43 is activated by applying voltage $V_{wl}$. Wordline 43 flips the stored state of the cell when it is different from the state being written into it. During the period the cell takes to flip, significant current may flow from array supply voltage $V_{DD}$ to bitline 40 or bitline bar 42, which has been pulled low. The greater the $V_{wl}$ and $V_{DD}$ voltages, the greater the peak current. Because the flipping process is over within a few tenths of a picosecond, the average current through array supply may be minimal. After the cell has finished flipping such that one inverter output node is at $V_{ss}$ and the other inverter output node is at $V_{DD}$, the current through a first access transistor, either 30 or 32, which is attached to the bitline pulled low, is negligible. The current through the second access transistor is similar as discussed above in the read cycle with bias condition of source at $V_{nom}$, drain at $V_{DD}$ and gate at $V_{wl}$. This current may be minimized by keeping the difference between $V_{wl}$ and $V_{nom}$ below the threshold voltage of second access transistor.

Because the threshold voltage for a SRAM cell is about 0.4 to 0.5v for a 1.8v 0.25 um technology node, significant performance improvement may be obtained by increasing wordline voltage and array supply voltage as illustrated in the table below.

The following table depicts simulated results using SPICE (Simulation Program with Integrated Circuit Emphasis). Array supply voltage current, $I_{dd}$, flows when wordline 43 is activated during the read and write cycles. The current that flows when the cell flips during the write cycle is ignored. The table also shows the cell read current (Iread), write trip voltage (Vtrip) and static noise margin (SNM) for the case of $V_{nom}=V_{DD}=V_{wl}=1.0V$ and where $V_{nom}=1.0V$, $V_{DD}=1.8V$ and $V_{wl}=1.5V$. The transistor widths and lengths were 0.40/0.27, 0.55/0.24, 0.36/0.24 (um/um) for the access, pull-down and pull-up transistors, respectively.

TABLE

| | $V_{nom}$ (V) | $V_{DD}$ (V) | $V_{wl}$ (V) | Iread (uA) | Vtrip (V) | SNM (mV) | $I_{dd}$ |
|---|---|---|---|---|---|---|---|
| Read | 1.0 | 1.0 | 1.0 | 27.5 | | 220 | 206 pA |
| Read | 1.0 | 1.8 | 1.5 | 94.0 | | 380 | 15 nA |
| Write | 1.0 | 1.0 | 1.0 | | 0.26 | | 311 pA |
| Write | 1.0 | 1.8 | 1.5 | | 0.38 | | 15 nA |

The results indicate significant improvement in the cell characteristics while keeping the $I_{dd}$ to a low value. The cell read current, Iread, has increased from 27.5 uA to 94 uA. The write trip voltage, Vtrip, also increased from 0.26V to 0.38V and the SNM increased from 220 mV to 380 mV. $I_{dd}$ per cell through the array supply increased from 206 pA during a read cycle to 15 nA, and from 311 pA during a write cycle to 15 nA with higher $V_{wl}$ and $V_{DD}$ values. For an array with 256 cells on each wordline at 50% activation, a 15nA per cell current results in about 2 uA array supply current, which is easily handled by a typical voltage boosting circuit. Also, increasing the array supply voltage reduces the soft error rates of the cells.

Various voltage boosting techniques may be used to boost the voltage. One is charge pump circuit. The voltage boosting circuits may be on the same chip as the SRAM, or may be off-chip.

In another embodiment, array supply voltage $V_{DD}$ may be equal to the wordline voltage $V_{WL}$. This embodiment may reduce the number of boosted supplies needed to operate array 200. Further, in a standby mode, when data is neither being read nor written into array 200, the array supply voltage $V_{DD}$ and the wordline voltage $V_{WL}$ may be the same as supply voltage $V_{nom}$ by turning off the voltage boosting circuitry, e.g., array voltage boosting circuit 204 and wordline voltage boosting circuit 212.

Thus, it is apparent that there has been provided in accordance with the present invention, a low voltage, low power static random access memory cell array that satisfies the advantages set forth above. Although the present invention has been described in detail, it should be understood that various changes, substitutions, and alterations can be made herein. For example, although direct connections are shown between transitions, these transistors may be coupled to each other by one or more intermediate components such as resistors, capacitors, and/or inductors while still providing a substantially similar operating capability. Other examples are readily ascertainable by one skilled in the art and can be made without departing from the spirit and scope of the present invention as defined by following claims.

What is claimed is:

1. A static random access memory array comprising:

a plurality of bitlines connected to a plurality of memory cells that include access transistors for reading and writing to the memory cell, each access transistor having a threshold voltage;

a power supply with an output voltage applied to the bitlines, wherein the output voltage pre-charges the bitlines to read from the memory cells;

an array power supply with an array voltage applied to the memory cells, wherein the array voltage is higher than the output voltage and the array power supply is driven by boosting the output voltage of the power supply; and a wordline bus connected to the access transistors, the wordline bus having a wordline voltage that is greater than the output voltage and less than the sum of the output voltage and the access threshold voltage.

2. The array of claim 1, wherein the power supply is an external power source.

3. The array of claim 1, wherein the power supply is on-chip.

4. A method of operating a static random access memory array having a plurality of bitlines connected to a plurality of memory cells, comprising the steps of;

pre-charging the bitlines with a supply voltage;

boosting the supply voltage to derive an array voltage; and applying the array voltage to the memory cells at a boosted level higher than the supply voltage;

reading and writing to the memory cells through access transistors having a threshold voltage; and applying a wordline voltage to the access transistors that is greater than the supply voltage and less than the sum of the supply voltage and the threshold voltage of the access transistors.

5. A static random access memory array, comprising:

a plurality of bitlines connected to a plurality of memory cells;

a supply voltage applied to the bitlines, wherein the supply voltage pre-charges bitlines to read from the memory cells;

a boosted array voltage applied to the memory cells, wherein the boosted array voltage is higher than the supply voltage, and derived by boosting the supply voltage;

a plurality of access transistors for reading and writing to the memory cells, wherein each of the plurality of access transistor has a threshold voltage; and a wordline bus having a wordline voltage when activated, and connected to the access transistors, wherein the wordline voltage is less than the sum of the supply voltage and the threshold voltage.

* * * * *